United States Patent
Holder et al.

(10) Patent No.: US 7,438,447 B2
(45) Date of Patent: Oct. 21, 2008

(54) APPARATUS AND METHOD FOR IMPROVED ILLUMINATION AREA FILL

(75) Inventors: Ronald G. Holder, Laguna Niguel, CA (US); Greg Rhoads, Irvine, CA (US)

(73) Assignee: Illumination Management Solutions Inc., Irvine, CA (US)

( * ) Notice: Subject to any disclaimer, the term of this patent is extended or adjusted under 35 U.S.C. 154(b) by 0 days.

(21) Appl. No.: 11/633,877

(22) Filed: Dec. 4, 2006

(65) Prior Publication Data

US 2007/0076414 A1 Apr. 5, 2007

Related U.S. Application Data

(62) Division of application No. 11/093,988, filed on Mar. 30, 2005, now Pat. No. 7,172,319.

(60) Provisional application No. 60/558,199, filed on Mar. 30, 2004.

(51) Int. Cl.
*F21V 7/00* (2006.01)

(52) U.S. Cl. .................. 362/346; 362/347; 362/327; 362/296; 362/341

(58) Field of Classification Search .............. 362/514, 362/516, 518, 215, 296, 297, 341, 346
See application file for complete search history.

(56) References Cited

U.S. PATENT DOCUMENTS

| | | | |
|---|---|---|---|
| 826,205 A | 7/1906 | Whitehouse | |
| 1,610,124 A * | 12/1926 | Godley | 362/293 |
| 2,666,193 A | 1/1954 | Keegan | |
| 4,034,217 A * | 7/1977 | Dumont | 362/297 |
| 4,101,957 A | 7/1978 | Chang | |
| 4,151,584 A | 4/1979 | Labrum | |
| 4,211,955 A | 7/1980 | Ray | |
| 4,218,727 A * | 8/1980 | Shemitz et al. | 362/297 |
| 4,286,311 A | 8/1981 | Maglica | |
| 4,388,673 A | 6/1983 | Maglica | |
| 4,392,187 A | 7/1983 | Bornhorst | |
| 4,398,238 A | 8/1983 | Nelson | |
| 4,500,947 A | 2/1985 | Perkins | |
| 4,530,040 A | 7/1985 | Petterson | |
| 4,533,984 A | 8/1985 | Gatton | |
| 4,570,208 A | 2/1986 | Sassmannshausen | |
| 4,577,263 A | 3/1986 | Maglica | |
| 4,583,153 A | 4/1986 | Tsuyama | |
| 4,698,730 A | 10/1987 | Sakai et al. | |
| 4,727,289 A | 2/1988 | Uchida | |

(Continued)

*Primary Examiner*—Jacob Y Choi
(74) *Attorney, Agent, or Firm*—Daniel L. Dawes

(57) ABSTRACT

A reflector for a light source, such as an LED, is provided with a shape which efficiently collects and directs energy to an illumined surface whereby almost 100% of the light is collected and distributed into a designer composite beam. The shape in one embodiment is comprised of three zones beginning with a parabolic surface of revolution at the base of the reflector, followed by a transition or straight conic zone and ending with an elliptical zone. In another embodiment the reflector shape is determined according to a transfer function which allows for arbitrary designer control of the reflected rays at each point on the reflector, which when combined with direct radiation from the source, results in a designer controlled composite beam or illumination. The device is more than 90% energy efficient and allows replacement of higher power, less energy efficient light sources with no loss in illumination intensity.

12 Claims, 8 Drawing Sheets

U.S. PATENT DOCUMENTS

| | | | |
|---|---|---|---|
| 4,729,076 A | 3/1988 | Masami et al. |
| 4,730,240 A | 3/1988 | Van Meel et al. |
| 4,733,337 A | 3/1988 | Bieberstein |
| 4,745,531 A | 5/1988 | Leclercq |
| 4,803,605 A | 2/1989 | Schaller et al. |
| 4,814,950 A | 3/1989 | Nakata |
| 4,941,070 A | 7/1990 | Ogawa et al. |
| 4,959,757 A | 9/1990 | Nakata |
| 4,962,450 A | 10/1990 | Reshetin |
| 5,001,609 A * | 3/1991 | Gardner et al. ............... 362/555 |
| 5,060,120 A | 10/1991 | Kobayashi et al. |
| 5,072,346 A | 12/1991 | Harding |
| 5,072,347 A | 12/1991 | Brunson |
| 5,103,381 A | 4/1992 | Uke |
| 5,136,491 A * | 8/1992 | Kano ......................... 362/346 |
| 5,249,109 A | 9/1993 | Denison et al. |
| 5,268,977 A | 12/1993 | Miller |
| 5,282,121 A | 1/1994 | Bornhorst et al. |
| 5,317,484 A * | 5/1994 | Davenport et al. .......... 362/551 |
| 5,335,158 A * | 8/1994 | Kaplan et al. ............... 362/303 |
| 5,408,363 A * | 4/1995 | Kano ......................... 359/869 |
| 5,477,263 A | 12/1995 | O'Callaghan |
| 5,526,248 A | 6/1996 | Endo |
| 5,528,474 A | 6/1996 | Roney et al. |
| 5,577,493 A | 11/1996 | Parkyn et al. |
| 5,618,102 A | 4/1997 | Ferrerll |
| 5,630,661 A | 5/1997 | Fox |
| 5,634,711 A | 6/1997 | Kennedy et al. |
| 5,673,990 A | 10/1997 | Neumann et al. |
| 5,711,590 A | 1/1998 | Gotoh et al. |
| 5,808,775 A | 9/1998 | Inagaki et al. |
| 5,836,668 A | 11/1998 | Ishikawa et al. |
| 5,857,767 A | 1/1999 | Hochstein |
| 5,897,196 A | 4/1999 | Soskind et al. |
| 5,899,559 A | 5/1999 | Lachmayer et al. |
| 5,904,417 A | 5/1999 | Hewett |
| 5,924,785 A | 7/1999 | Zhang et al. |
| 5,934,795 A | 8/1999 | Rykowski et al. |
| 5,954,428 A | 9/1999 | Eichhorn et al. |
| 5,971,569 A | 10/1999 | Smith et al. |
| 5,986,779 A | 11/1999 | Tanaka et al. |
| 6,007,210 A | 12/1999 | Yamamoto et al. |
| 6,045,240 A | 4/2000 | Hochstein |
| 6,076,948 A | 6/2000 | Bukosky et al. |
| 6,123,440 A | 9/2000 | Albou |
| 6,168,288 B1 | 1/2001 | St. Claire |
| 6,220,736 B1 | 4/2001 | Dobler et al. |
| 6,227,685 B1 | 5/2001 | McDermott |
| 6,252,338 B1 | 6/2001 | Bergman et al. |
| 6,280,071 B1 | 8/2001 | Yamamoto et al. |
| 6,354,721 B1 | 3/2002 | Zattoni |
| 6,371,636 B1 | 4/2002 | Wesson |
| 6,406,171 B1 | 6/2002 | Satsukawa et al. |
| 6,485,160 B1 | 11/2002 | Sommers et al. |
| 6,502,952 B1 | 1/2003 | Hartley |
| 6,536,899 B1 | 3/2003 | Fiala |
| 6,547,423 B2 | 4/2003 | Marshall et al. |
| 6,560,038 B1 | 5/2003 | Parkyn, Jr. et al. |
| 6,575,609 B2 | 6/2003 | Taniuchi et al. |
| 6,575,610 B2 | 6/2003 | Natsume |
| 6,603,243 B2 | 8/2003 | Parkyn et al. |
| 6,641,287 B2 | 11/2003 | Suchiro |
| 6,685,336 B1 | 2/2004 | Neiser |
| 6,741,406 B2 | 5/2004 | Kitamura et al. |
| 6,796,690 B2 | 9/2004 | Bohlander |
| 6,796,698 B2 | 9/2004 | Sommers et al. |
| 6,827,467 B2 | 12/2004 | Tenmyo |
| 6,854,865 B2 | 2/2005 | Probst et al. |
| 7,172,319 B2 * | 2/2007 | Holder et al. ............... 362/341 |
| 2002/0105809 A1 | 8/2002 | Kuijk et al. |
| 2002/0145884 A1 | 10/2002 | Yamamoto |
| 2002/0176255 A1* | 11/2002 | Yamauchi et al. ........... 362/299 |
| 2003/0007359 A1 | 1/2003 | Sugawara et al. |
| 2003/0090906 A1 | 5/2003 | Hayakawa |
| 2004/0017685 A1 | 1/2004 | Dedoro |

\* cited by examiner

APPARATUS AND METHOD FOR IMPROVED ILLUMINATION AREA FILL

RELATED APPLICATIONS

The present application is a divisional application filed pursuant to 35 USC 120 of U.S. patent application Ser. No. 11/093,988 filed on Mar. 30, 2005 and now issued as U.S. Pat. No. 7,172,319, which in turn was related to U.S. Provisional Patent Application, Ser. No. 60/558,199, filed on Mar. 30, 2004, which is incorporated herein by reference and to which priority is claimed pursuant to 35 USC 119.

BACKGROUND OF THE INVENTION

1. Field of the Invention

The invention relates to the field of methods and apparatus for providing illumination and in particular to methods and apparatus that are energy efficient, typically in excess of 90% energy efficiency and thus are specially suitable for low power light sources, thereby allowing replacement of higher power, less energy efficient light sources with no loss in illumination intensity.

2. Description of the Prior Art

The typical LED emitter radiates its light energy in a nearly hemispherical beam pattern. Most LED applications require substantial modification of this output beam profile to provide useful energy. The typical means of modifying this LED energy in the body of prior art are conic reflectors, lenses, or a combination of these.

One of the most widely used means of developing a beam from an LED source is the use of a hemispherical ball lens. The lens is typically placed with its center approximately one radius distance off the center of the emitter. To provide a means to place this lens above the emitter, a cylindrical surface is incorporated that extends from the base of the hemisphere backward toward the emitter. This solution utilizes about 60% of the energy available from the LED and creates a relatively smooth spot whose beam angle is based on the ratio of LED emitter size to ball lens diameter. This is the method utilized in the standard 3 mm and 5 mm LED packages. This is a relatively efficient optical solution for a small device, but not optimum in collection efficiency. A major drawback of this method is chromatic aberration generated by the design that is particularly undesirable when utilized in 'white' LED systems.

Another common technique is the use of a single surface of rotation-conic reflector. When the cross-section is a parabola or an ellipse with a long focus the beam produced is much brighter in the center than in its periphery. While very useful for flashlights and some other devices, this is not appropriate for all LED illumination needs. When the cross-section is an ellipse with a short focus a portion of the resultant beam crosses its centerline axis and creates a center zone or 'hole' of less energy in the illumination pattern at a distance. Attempts to generate a smooth beam from either of these configurations, generally with the addition of a diffuser, result in a substantial loss of efficiency.

A modest improvement to the ball lens approach is an integrated optical system incorporating features of both the ball lens and a conic reflector in a single optical device. The energy pattern radiating from this approach suffers similar chromatic aberration, or color separation, with 'white' LEDs as does the ball lens system. This method is slightly more efficient than the ball lens device.

A common method of creating a beam from a light source in the prior art is the CPC, Compound Parabolic Concentrator. This means was actually developed to collect energy toward a focus for solar line collectors, but more recently has been added to the art of reflector design.

BRIEF SUMMARY OF THE INVENTION

The invention is defined in one embodiment as an apparatus for illuminating a surface comprising a light source whose intensity varies as a function of the angles of the light rays radiated from the light source in a three dimensional radiation pattern, and a reflector having a base and aperture. The reflector is proximate to the light source and defines a system half angle by its aperture, which allows directly radiated energy to propagate from the light source through the aperture of the reflector to the surface to provide a directly radiated energy distribution pattern on the surface. The reflector has three distinct conic shaped zones, each providing a surface of revolution. The first zone is parabolic, the second zone is a straight conic and the third zone is elliptical, in that order, beginning with the base of the reflector and moving toward its aperture. These zones provide a designer controlled reflected energy distribution pattern overlaid onto the directly radiated energy distribution pattern on the surface, which reflected energy distribution pattern combines with the directly radiated energy distribution pattern to produce a designer controlled composite energy distribution pattern on the surface.

Substantially all or at least 90% of the light generated from the light source is in the designer controlled composite energy distribution pattern on the surface.

In one embodiment the reflector comprises a total internal reflector (TIR). In another embodiment the light source comprises an LED light source and the total internal reflector (TIR) is integrally manufactured as a package covering for or is optically integrated with the LED light source.

The total internal reflector further comprises a reflective coating disposed on a selected portion of the exterior of the total internal reflector to insure internal reflection of light therein.

In still another embodiment the invention further comprises a solid or stranded optical fiber where the designer controlled composite energy distribution pattern is into the solid or stranded optical fiber.

In yet another embodiment the invention further comprising a light fixture in which the light source and reflector are included. The light fixture comprises a PAR fixture, an MR fixture, a street lamp, an array, or an LCD panel light, signage light, airplane light, auto light, marine light, indoor or outdoor architectural light, decorative light, task light, or flood light.

The invention can further be characterized as a method for illuminating a surface comprising the steps of directly radiating light from a light source whose intensity varies as a function of the three dimensional solid angles of the light rays radiated from the light source, and reflecting light from a reflector having a base and aperture. The reflector is proximate to the light source, and defines a system half angle by its aperture and allowing directly radiated energy to propagate from the light source to the surface to provide a directly radiated energy distribution pattern on the surface. The reflector has three distinct conic shaped zones, each providing a surface of revolution. The first zone is parabolic, the second zone is a straight conic and the third zone is elliptical, in that order, beginning with the base of the reflector and moving toward its aperture. What is provided is a designer controlled reflected energy distribution pattern overlaid onto the directly radiated energy distribution pattern on the surface, which reflected energy distribution pattern combines with the directly radiated energy distribution pattern to produce a designer controlled composite energy distribution pattern on the surface.

Another embodiment of the invention is a method of computerized design of a shape of a reflector having a three dimensional surface, a base and aperture. The reflector reflects light from a light source whose intensity varies as a function of three dimensional solid angles of the light rays radiated from the light source. The method comprises the steps of: characterizing the entire intensity and spatial distribution pattern of light radiating from the light source as data in a computer; determining the desired energy pattern at a destination as a final data solution in the computer; determining the desired distance from light source to the destination as a data input to the computer; deriving the desired two dimensional half angle from the data, measured from the common axis of the light source and reflector, including determining the reflector height and aperture width, to allow directly radiated light to propagate from the light source to the destination; calculating the remainder of the difference between the total available light from the light source less the directly radiated light; and defining the three dimensional surface of the reflector as three distinct conic shaped zones, each providing a surface of revolution. The first zone is parabolic, the second zone is a straight conic and the third zone is elliptical, in that order, beginning with the base of the reflector and moving toward its aperture. What results is a designer controlled reflected light overlaid onto the directly radiated light, which reflected light combines with the directly radiated light to form a user-defined composite light pattern at the destination.

The invention is still further embodied as an apparatus for illuminating a surface comprising a light source whose intensity varies as a function of the angles of the light rays radiated from the light source in a three dimensional radiation pattern, and a reflector having an aperture. The reflector is proximate to the light source, defines a system angle by its aperture and allows directly radiated energy to propagate from the light source through the aperture of the reflector to the surface to provide a directly radiated energy distribution pattern on the surface. The reflector has a defined shape derived from a transfer function, which has as inputs: the three dimensional radiation pattern of the light source; beam parameters, such as light source-to-surface distance and beam diameter; system parameters of the reflector such as reflector size and aperture size of the reflector; and a desired composite energy distribution on the surface. The transfer function has as outputs: an amount of directly radiated energy propagating through the aperture of the reflector; a remainder of the total available radiated energy from the light source less the energy of the light directly radiating to the surface through the reflector aperture; and a calculated position and orientation of each point on the reflector as a function of angle needed to provide the desired composite energy distribution on the surface, which calculation defines the shape of the reflector necessary to provide a reflected energy pattern to overlay the directly radiated energy pattern to form the designer controlled composite energy distribution on the surface.

In the same manner the invention is also embodied as a method for illuminating a surface comprising: radiating light from a light source whose intensity varies as a function of the angles of the light rays radiated from the light source in a three dimensional radiation pattern, and reflecting light from a reflector having an aperture, the reflector being proximate to the light source, defining a system angle by its aperture and allowing directly radiated energy to propagate from the light source through the aperture of the reflector to the surface to provide a directly radiated energy distribution pattern on the surface. The reflector has a defined shape derived from a transfer function, which has as inputs: the three dimensional radiation pattern of the light source; beam parameters, such as light source-to-surface distance and beam diameter; system parameters of the reflector such as reflector size and aperture size of the reflector; and a desired composite energy distribution on the surface. The transfer function has as outputs: an amount of directly radiated energy propagating through the aperture of the reflector; a remainder of the total available radiated energy from the light source less the energy of the light directly radiating to the surface through the reflector aperture; and a calculated position and orientation of each point on the reflector as a function of angle needed to provide the desired composite energy distribution on the surface, which calculation defines the shape of the reflector necessary to provide a reflected energy pattern to overlay the directly radiated energy pattern to form the designer controlled composite energy distribution on the surface.

The invention is also characterized in one embodiment as a method of computerized design of a shape of a reflector having a three dimensional surface, a base and aperture, the reflector for reflecting light from a light source whose intensity varies as a function of three dimensional angles of light rays radiated from the light source comprising defining a shape for the reflector which shape is derived from a transfer function in a computer, which transfer function comprises inputting: the three dimensional radiation pattern of the light source; beam parameters, such as light source-to-surface distance and beam diameter; system parameters of the reflector such as reflector size and aperture size of the reflector; and a desired composite energy distribution on the surface. The method includes outputting: an amount of directly radiated energy propagating through the aperture of the reflector; a remainder of the total available radiated energy from the light source less the energy of the light directly radiating to the surface through the reflector aperture; and a calculated position and orientation of each point on the reflector as a function of angle needed to provide the desired composite energy distribution on the surface, which calculation defines the shape of the reflector necessary to provide a reflected energy pattern to overlay the directly radiated energy pattern to form the designer controlled composite energy distribution on the surface.

The invention is alternatively embodied as an apparatus for illuminating a surface with an arbitrarily selected composite energy distribution comprising a light source, and a reflector having an aperture. The reflector is proximate to the light source. Light is directly radiated from the light source through the aperture of the reflector to the surface to provide a directly radiated energy distribution pattern on the surface. The reflector has a selectively defined shape at each point with a selectively defined spatial position and selectively defined orientation derived from the arbitrarily selected composite energy distribution, which reflector generates a reflected energy distribution onto the surface, which when overlaid onto the directly radiated energy distribution pattern on the surface produces the arbitrarily selected composite energy distribution on the surface.

Still further the invention is characterized in an embodiment as an apparatus for illuminating a surface comprising a light source whose intensity varies as a function of the three dimensional solid angles of the light rays radiated from the light source, and a reflector having a base and aperture. The reflector is proximate to the light source, defines a system angle by its aperture and allows directly radiated energy to propagate from the light source through the aperture of the reflector to the surface to provide a directly radiated energy distribution pattern on the surface. The reflector has at least two conic shaped zones and another zone, each zone providing a surface of revolution. The first zone is parabolic, the second zone is a transition surface and the third zone is elliptical, in that order, beginning with the base of the reflector and moving toward its aperture, the transition surface extending between the first and third zones. What results is a designer controlled reflected energy distribution pattern overlaid onto the directly radiated energy distribution pattern on the surface, which reflected energy distribution pattern combines with the directly radiated energy distribution pattern to produce a designer controlled composite energy distribution pattern on the surface.

In yet another embodiment the invention is defined as an apparatus for illuminating a surface comprising a light source, and a reflector having an aperture. The reflector is proximate to the light source, and allows directly radiated energy to propagate from the light source through the aperture of the reflector to the surface to provide a directly radiated energy distribution pattern on the surface. The reflector has a plurality of shaped zones, each zone for directing light into a selected portion of a composite energy distribution pattern on the surface to provide a designer controlled reflected energy distribution pattern overlaid onto the directly radiated energy distribution pattern on the surface to produce the composite energy distribution pattern on the surface. In one embodiment the invention is an apparatus for illuminating a surface comprising a light source whose intensity varies as a function of the angles of the light rays radiated from the light source in a three dimensional radiation pattern, and a reflector having a base and an aperture. The reflector receives light from the light source. The light source is directed toward the base of the aperture and is disposed longitudinally forward of the base of the reflector. The reflector has a defined shape derived from a transfer function, which has as inputs: the three dimensional radiation pattern of the light source; beam parameters, such as light source-to-reflector distance, reflector-to-surface distance, and beam diameter; system parameters of the reflector such as reflector size and aperture size of the reflector; and a desired energy distribution on the surface. The transfer function has as outputs: an amount of radiated energy propagating through the aperture of the reflector; and a calculated position and orientation of each point on the reflector as a function of angle needed to provide the desired energy distribution on the surface, which calculation defines the shape of the reflector necessary to provide a reflected energy pattern, where the transfer function configures the shape of the reflector to send reflected light from a first portion of the reflector extending from the base of the reflector to a predetermined demarcation on the reflector to an first portion of the energy distribution on the surface which is arbitrarily designer selected, and where the transfer function configures the shape of the reflector to send reflected light from a second portion of the reflector extending from the predetermined demarcation on the reflector to the aperture of the reflector to a second portion of the energy distribution on the surface which is arbitrarily designer selected.

In yet another embodiment the invention is an apparatus for illuminating a surface comprising a light source whose intensity varies as a function of the angles of the light rays radiated from the light source in a three dimensional radiation pattern, a reflector having an aperture, the reflector being proximate to the light source, defining a system angle by its aperture, and a lens for allowing radiated energy directly from the light source to propagate through the lens to the illuminated surface to provide a directed energy distribution pattern on the illuminated surface. The reflector has a surface and defined shape derived from a transfer function, which has as inputs: the three dimensional radiation pattern of the light source; beam parameters, such as light source-to-surface distance and beam diameter; lens parameters, system parameters of the reflector such as reflector size and aperture size of the reflector; and a desired composite energy distribution on the illuminated surface. The transfer function has as outputs: an amount of directed radiated energy propagating through the lens; a remainder of the total available radiated energy from the light source less the energy of the directed light propagating to the illuminated surface through the lens; and a calculated position and orientation of each point on the surface of the reflector as a function of angle needed to provide the desired composite energy distribution on the illuminated surface, which calculation defines the shape of the reflector necessary to provide a reflected energy pattern to overlay the directed energy pattern to form the designer controlled composite energy distribution on the surface.

In one embodiment the points of the surface of the reflector comprise a plurality of shaped surface zones, each surface zone for directing light into a selected portion of a composite energy distribution pattern on the surface to provide a designer controlled reflected energy distribution pattern overlaid onto the directed energy distribution pattern on the illuminated surface to produce the composite energy distribution pattern on the illuminated surface.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

Figure 1:
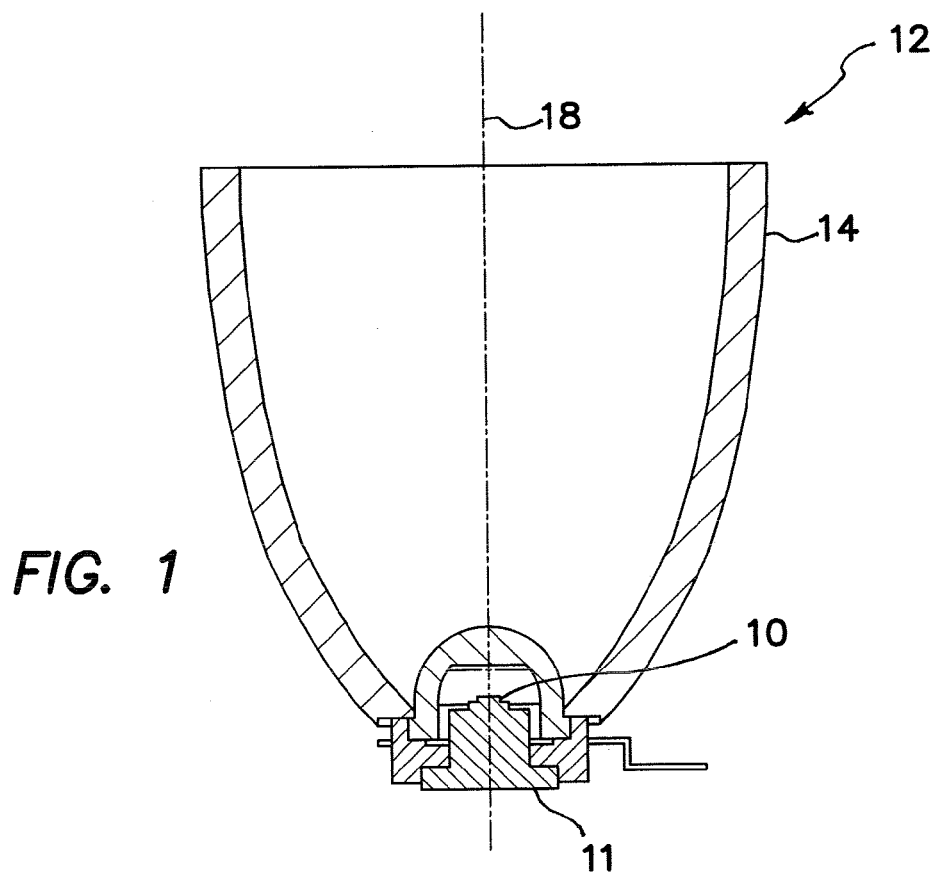
FIG. 1 is a cross-sectional diagram of a preferred embodiment of the invention in which a reflector having conic sections is placed over the emitter of a commercially available LED and in one embodiment of which the reflector surface is comprised of three conic sections. The embodiment may be called a triconic device.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The preferred embodiment of the invention is directed to light emitting diodes (LED) and a method of collecting and distributing the energy radiated from them with increased energy efficiency. In fact, in the case of LED light sources, the preferred embodiment results in energy efficiencies approximately equal to or better than 90%. However, it is to be expressly understood that the invention is not limited to LED light sources, but may be employed with incandescent, plasma arc, fluorescent light sources or any type of light source now known or later devised, particularly those with similar or equal energy efficiencies. In addition, it must be understood that the term, "light" is used in its broadest sense as including the ultraviolet and infrared portions of the spectrum and that any light frequency which can be approximately modeled by optical ray tracing is contemplated was being within the scope of the invention.

Devices utilizing the invention would be used in general lighting, decorative and architectural lighting, reading lights for home, airline or automobile, task lighting, flood lighting, emergency lighting, fiber optic illumination, panel backlighting, signage and other applications too numerous to mention. A complete listing is impossible to provide and thus it must be understood that the larger assemblies or systems in which various embodiments of the invention could be used include all applications of illumination now known or later devised. Further, the various embodiments of the invention can also be used as the basis for or in combination with more complex optical systems with having additional optical elements and optical processing. The illustrated embodiments of the invention provide virtually complete collection efficiency of the energy radiating from an LED into a desired or directed beam. The distribution of energy in the resultant beam is controlled by design and capable of being predetermined or controlled by arbitrary design or user choice.

The illustrated embodiments of the invention provide a substantial improvement over the prior art for generating a controlled, smooth beam from an LED source and utilize substantially all the energy radiating from the LED in doing so. The transmission of light through a medium, such as through a lens, total internal reflector (TIR), across an optical interface, or reflection of light from a reflecting surface is never perfect or 100%. These inherent loss events are defined for the purposes of this specification as an "optical touch" or simply a "touch" on or of the light, sometimes also referenced as a "modification" of the light. With currently available commercial grade reflectors losses of the order of about 8% of the light intensity on one touch and with currently available commercial grade lens or TIR's losses of the order of 4% of the light intensity on one touch would be typical. Therefore, some energy is always lost in an optical touch. The term, "substantially all" for the purpose of this specification and its claims shall be understood to mean all of the light generated by the light source within a frequency bandwidth of interest reduced only by inherent losses in a minimum of touches of the light, such as one or two touches from refraction or reflection, or at least that amount of loss of light intensity such that it would not be readily discernible to the unaided human eye.

Illumination systems generate beams that are collimated, like a searchlight, omni-directional; such as fluorescent tube or standard light bulb; narrow conical light patterns, such as a spot light; broad conical light patterns, such as a floodlight or some combination of these. The invention has its primary advantage in the ability to efficiently create narrow and broad conical light patterns from the energy radiating from the LED emitter 10 mounted on a conventional heat sink or package substrate 11.

Figure 3:
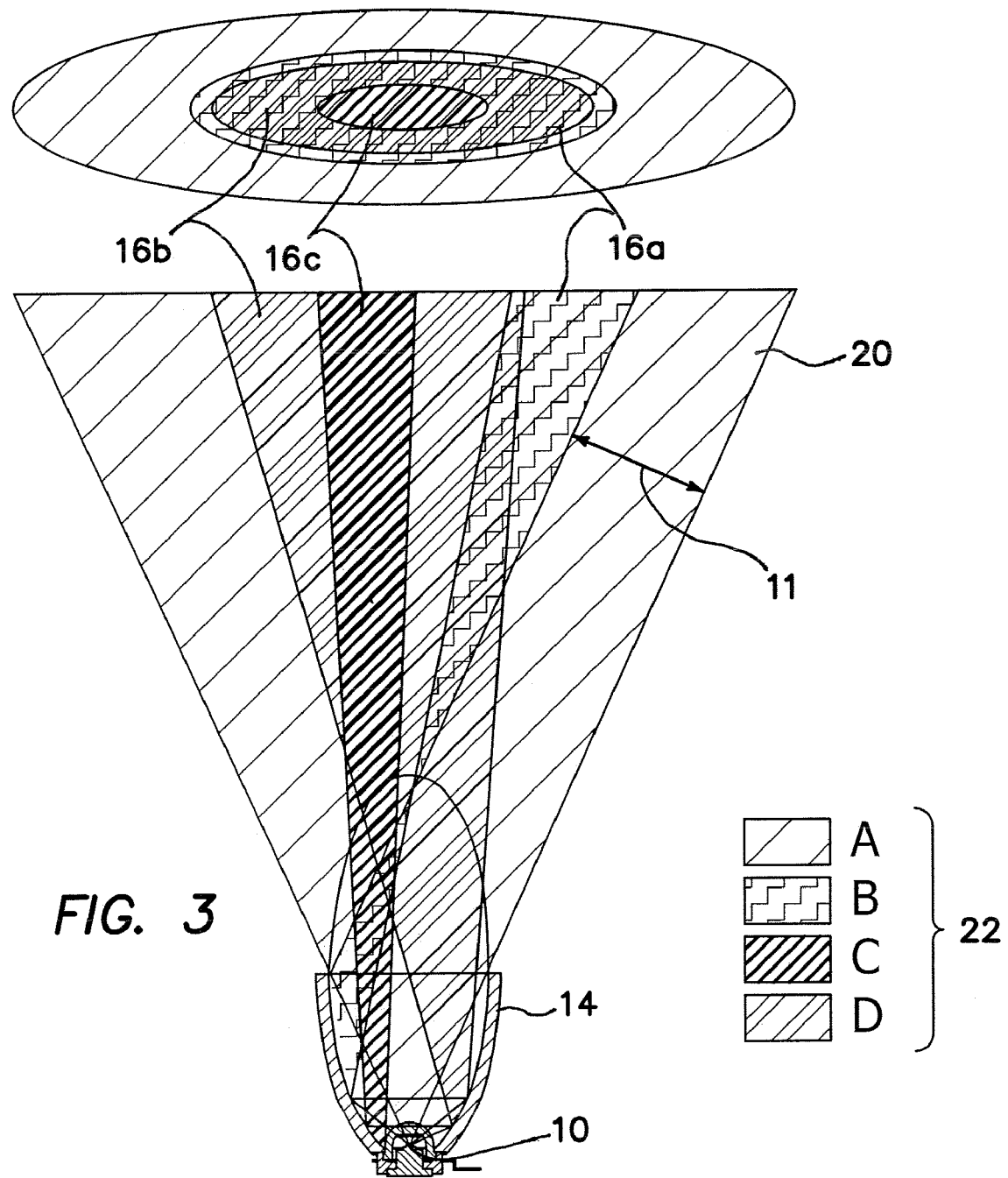
FIG. 3 is a cross-sectional diagram of the ray sets of the beam pattern generated by the embodiment of FIGS. 1 and 2. The upper portion of FIG. 3 is a skewed projected view of the beam at the target surface to more clearly describe the overlay of the reflected energy and the direct energy of the light source. For clarity, only one side of the reflected energy is shown, which must be understood to be completed by rotating the cross-sectional pattern about the axis of symmetry of the reflector.

In the preferred embodiment of the invention the energy radiating from the LED emitter 10 is segmented or partitioned into two regions or ray sets defined about the optical axis of the LED 10, which are each treated or optically processed differently. Throughout this specification the term "energy" shall be taken to mean both energy, e.g. Joules, and power or energy per unit time, e.g. Watts. It shall be assumed in the following discussion that LED 10 always has an optical axis of symmetry so that its radiation pattern is approximately symmetric about an axis within manufacturing tolerances. LED chips or light emitting interfaces are typically manufactured to be square or rectangular in shape and have three dimensional radiation patterns which map the shape of the light emitting interface. It is to be understood that the invention is not limited to symmetric light emitting interfaces or radiation patterns and can be modified in manner consistent with the teachings below to accommodate an arbitrarily shaped radiation pattern or light emitting interface. The first region or ray set 20 (ray set A in FIG. 3) is the central conical energy radiating from the LED emitter 10 as best shown in FIG. 3. The second region or ray set 22 is the remainder of the nearly hemispherical distribution of energy radiating from an LED emitter 10, which are shown collectively in FIG. 3 as the ray sets B, C and D. Again, it must be clearly appreciated that conventional LED emitters actually have a radiation distribution pattern which extends below the horizon or the 90° half angle from the normal to the light emitting interface or the polar angle. Typically, conventional LED emitters have a radiation distribution patterns extending down to 95-100° half angles, although the intensity of the light in these angles decreases dramatically. in the balance of this specification It will be assumed for the sake of simplicity that the radiation distribution pattern extends to the 900 ° half angle, but the modification necessary to include larger half angles can readily be made in a manner consistent with the teachings of the invention.

In the preferred embodiment of the invention the energy in the first region 20 remains optically unmodified or untouched and is radiated directly to the target or surface to be illuminated. By not placing any optical surface in the path of light in this first region 20, there are no losses of energy from the LED emitter 10 to the target of the beam. The included angle chosen for the cone of energy in this first region 20 is defined as the design or system angle of the device 12. The preferred embodiment of the invention is practical for included half angles of approximately 10°-70°.

Figure 2:
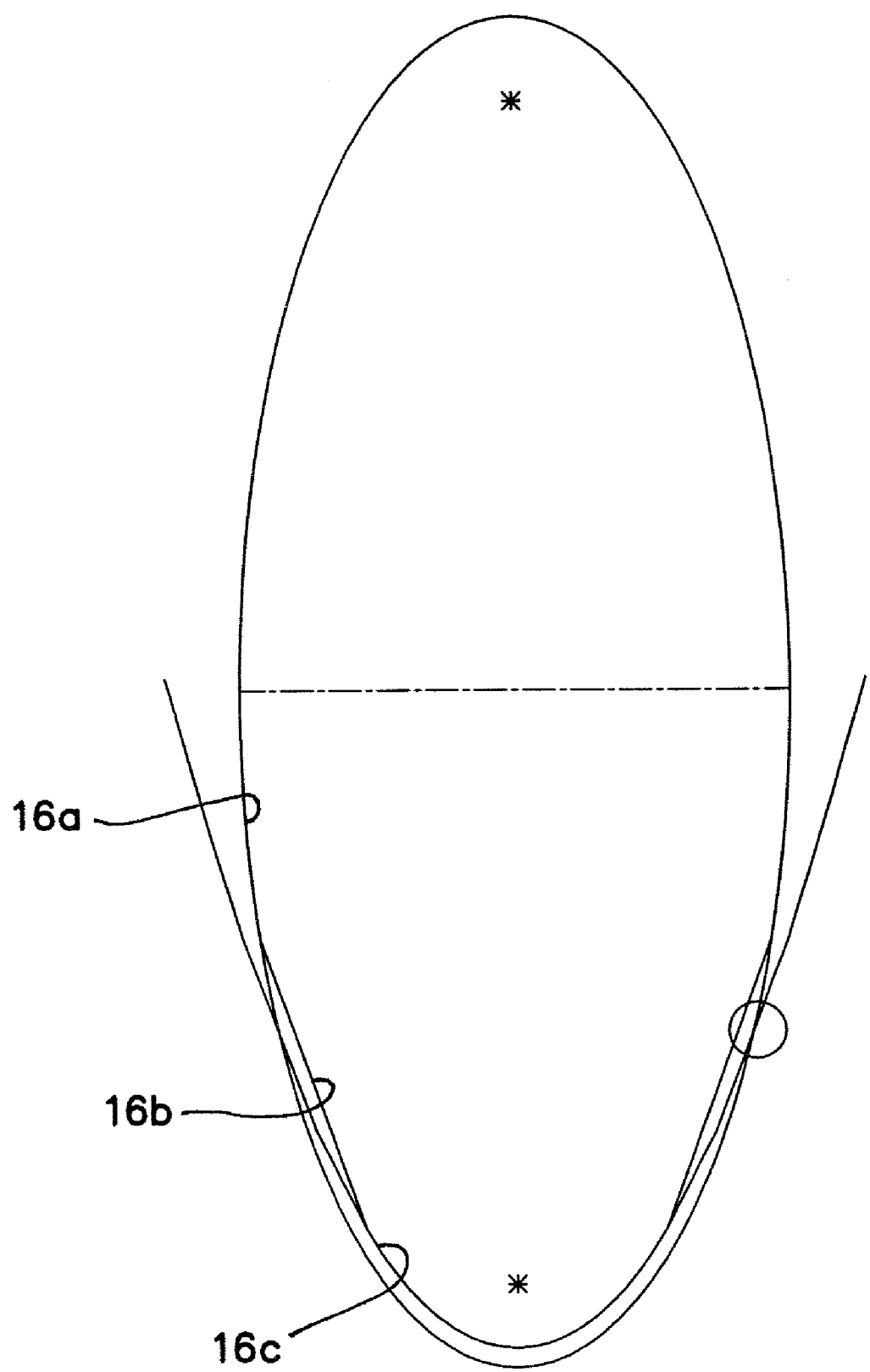
FIG. 2 is a simplified line diagram of the two dimensional cross-sectional profiles of the cross-sectional surfaces of the reflector of FIG. 1.

The energy of the second region 22 is modified by the surface or surfaces 16 of either a custom designed partially, multisectioned reflector 14 or a single reflector surface 16 defining a surface of rotation, which is also custom tailored or shaped. In one preferred embodiment of the invention, the reflector surface 16 is divided into three zones 16a, 16b and 16c as best depicted in FIG. 2. By selecting the appropriate two dimensional collection angle or half angle for each of these three zones 16a, 16b and 16c of the reflector 14, a unique, arbitrarily designer controlled distribution of energy in the beam can be defined. The energy of the beam generated by the reflector 14 from the second region 22 is added to the energy of the direct light from source 10 of the first region 20. Therefore, the only loss of energy in the system is the surface loss of the portion of the LED energy that is touched or modified by the reflector 14 from the second region or ray sets 22. Thus, the remainder of the emitted energy from the LED 10 is distributed into the intended beam, resulting in almost 100% collection and almost 100% distribution of the light.

The illustrated zones 16a, 16b and 16c of the reflector 14 can be described using the two dimensional collection angles or half angles derived between a ray line perpendicular to the emitter 10 passing through its center (also called the normal ray or optical axis 18 of emitter 10) and another ray line passing also through the center but inclined at an angle from the original perpendicular line or normal. The first reflector zone 16a, farthest from the emitter 10 (giving rise to ray set B in FIG. 3), and defining the upper peripheral portion of reflector 14, is generally described in the illustrated embodiment as a surface of rotation about the axis 18 of the system, whose two dimensional-profile could be a conic, generally a partial segment of an ellipse, with one focus placed near the center of the emitter 10. Hence, all light which is reflected by first zone 16a will be focused at or near the second focus of the ellipse. The farthest point on reflector 14 from the emitter 10 on the two dimensional profile of the first zone 16a is coincident with the ray line described above as being the half-angle of the intended or system beam. In the preferred embodiment of the invention, this point is nearly perpendicular to the mid point between two foci of an ellipse.

This allows the two distinct beams derived from region 20 and region 22 of the system to overlay almost perfectly upon each other although their degree of overlap is minimized by the diagrammatic depiction of FIG. 3. At a greater relative distance from emitter 10 rays from regions 20 and 22 than the depiction of FIG. 3 permits, there is nearly complete overlap of the patterns from regions 20 and 22 on the illuminated surface. The collection angle for a particular embodiment of the invention of this zone 16a of the reflector is determined by the requirements of the design for the composite energy distribution of the beam on the illuminated surface. The zone 16c (giving rise to ray set C in FIG. 3) of the reflector 14, closest to the emitter 10, can also be defined as a surface of revolution about the axis 18 of the system whose two dimensional-profile could be a conic, generally a parabola, with its focus placed near the center of the emitter 10. Hence, light reflected by zone 16c of reflector 14 is approximately collimated and parallel to optical axis 18. In a preferred embodiment of the invention, the parabolic profile would be placed in a position so that the sagitta of the parabola or the distance from upper limits of the parabolic surface or zone 16c to the chord across the upper limits is inside the ellipse of the first zone 16a of the reflector 14. The collection angle of zone 16c of the reflector 14 is also chosen based on the parameters of the design of the system, such as the depth and aperture size of reflector 14, and the distance from emitter 10 to the illumined surface.

Continuing with a preferred embodiment of the invention, a third zone 16b of the reflector 14 (giving rise to ray set D in FIG. 3) is a segment of a cone, whose cross-section is a line that extends between the endpoints of the two dimensional-profiles of the farthest and nearest 16a and 16c respectively. In other words, zone 16b is a right circular conic section which transitions between zones 16a and 16c. This cross-section profile of zone 16b could also be any shape of curve that connects the zones 16a and 16b described above and which is optionally tangent or approximately tangent to the respective endpoints of zones 16a and 16b, i.e. provides for a smooth transition between zone 16a and zone 16c or at least visually appears to be smooth to the unaided human eye.

In general, the illustrated embodiment of the invention anticipates two or more defined zones 16a and 16c and/or the addition of facets in the cross-sections and/or the surface of revolution or other means to provide integration, or homogenization of the resultant composite beam. The illustrated embodiments of the invention described above could be loosely referred to as triconic devices 12, but it must be understood that only two of the zones 16a and 16b need be in the shape of conic sections.

A plurality of devices 12 incorporating the invention may be assembled into arrays and/or included in an assembly of optical elements to provide additional functionality according to conventional design principles. Arrays of two or more units of the invention may include devices that are individually optimized for a particular set of design criteria. These arrays would be used for backlights for LCD monitors and other panel displays. These arrays could be utilized for backlighting of signs.

The preferred embodiments could be constructed as either a reflector, a TIR optic that can optionally be attached onto the LED package, or an OEM package replacement optic which is integrally made with the LED package.

In another preferred embodiment of the invention reflector 14 is designed using a transfer function to map the three dimensional energy distribution of the LED emitter 10 to the two dimensional energy pattern desired for the output beam of a device 12 of the invention. Again, for the sake of simplicity, it will be assumed that emitter 10 has an axis of symmetry so that its energy distribution pattern can be usefully described by only referencing two dimensional half angles or the polar angle of the energy distribution pattern. Where the energy distribution pattern of a light source 10 is free form or entirely arbitrary and has no symmetry, the transfer function of the invention can be appropriately modified in a manner consistent with the teachings of the invention to accommodate such irregularity.

In the illustrated embodiment the transfer function results in each point of a surface of revolution defining the surface of reflector 14 having surface normals about which the light energy is reflected across or parallel to the centerline 18 of the device 12 and which reflecting surface distributes the light energy into a reflected beam that overlays or partially overlays the directly radiated energy from light source 10 which does not reflect off the reflector 14. As will be appreciated by the disclosure below, the reflected beam and hence the composite beam will have an energy or intensity distribution which is determined by arbitrary user definition or selection.

This preferred embodiment of the invention is determined by the following method which is preferably performed in a computer (not shown). First, the system half-angle, reflector aperture diameter and distance from the light source 10 to the intended target are determined based on selected design criteria. This establishes the outermost point on the rim of the reflector 14. All the energy of the LED 10 that is narrower in angle from the centerline 18 than that determined by the design criteria is radiated directly to the intended target surface. The distribution of energy in the target zone is calculated and utilized in the reflector surface point calculations that follow. If the target is a two dimensional flat surface and if a standard Lambertian LED 10 is used, the energy distribution will fall off nearly as the cosine of the angle off of the centerline 18 of the system. The system angle and source-to-target distance define a starting radius for the energy distribution pattern on the target.

Next, the pattern of the distribution of the remaining energy radiated from the source 10 can be modified or not, based again on selected design criteria. In a preferred embodiment, the distribution pattern on the target surface is intended to be nearly flat in the reflected beam. This is accomplished by dividing the radiated LED energy distribution into small angular increments, $\Delta\theta$, and first summing the energy content of the directly radiated beam into the forward central solid angle of the system. The energy content of the directly radiated beam is subtracted from the total energy radiated from the LED 10 and the remainder is used for calculating the reflector points or segments. The energy content of each of the angular increments, $\Delta\theta$, is normalized across the angles of the remaining LED energy, which will be reflected.

$$\text{normalization factor} = \frac{\text{energy in angular increment } \Delta\theta}{(\text{total radiated energy} - \text{directly radiated energy})}$$

As an example, if one-degree increments, $\Delta\theta$, are chosen and the half angle of the system is thirty degrees, then the energy in the first thirty degrees is subtracted from the total energy radiated by the LED 10. Assuming an LED with 100° half angle output, the remaining 70° of angle, the peripheral solid angle of LED 10, is normalized by its percent of the total remaining energy. For example, if 0.75 watt of the energy is directly radiated to the target surface from a 1.0 watt source 10 in the 30° half-angle, leaving 0.25 watt to be radiated into 70° half angle which will be reflected, then the energy or power content of each of the angular increments in the 70° half angle are normalized to provide the fraction or percentage of the 0.25 watt which will be distributed among those angular increments, $\Delta\theta$.

Figure 7:
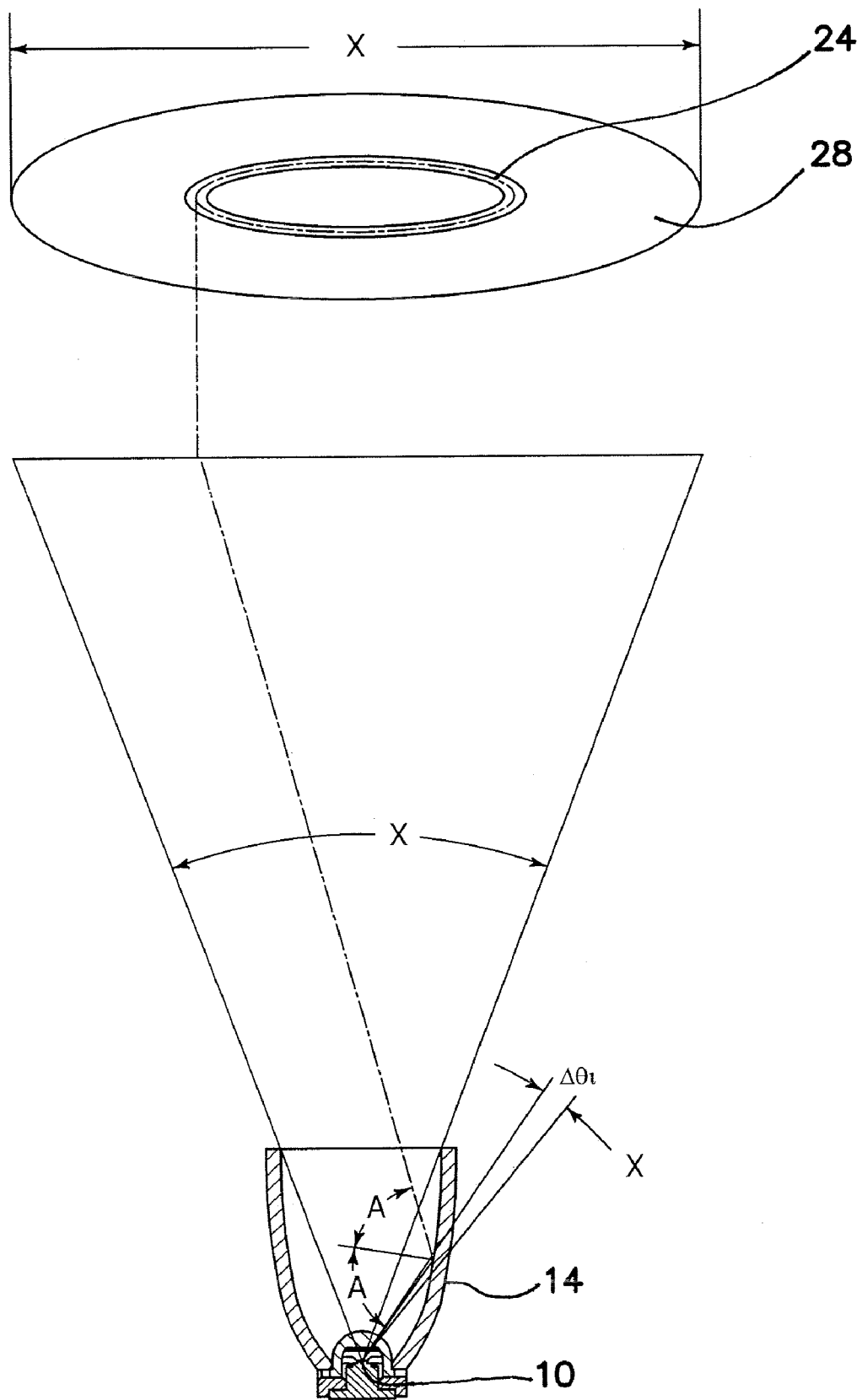
FIG. 7 is a cross-sectional diagram of the device of FIG. 6 showing a an incremental area or angular increment of the reflector and its relative contribution to the overlaid reflected beam. A skewed projected view is also shown in the upper part of the figure to illustrate the increment's contribution to the overlaid reflected beam.

Then the area of the target is calculated. Starting at the first incremental angle, $\Delta\theta_1$, just inside the edge of the aperture 26 of the reflector 14, the portion of the remaining energy incident on the incremental angle, $\Delta\theta_1$, is mapped onto a corresponding incremental area of the target surface 28, which is the illustrated embodiment is a circular ring 24 as best shown in FIG. 7. In this example, the source-to-target magnification ratio is ignored. It can be calculated and considered and it is the intention of the invention to allow for this calculation, however, it is instructive to describe the simpler case. Each angular increment, $\Delta\theta_i$, is characterized by a ratio of the energy reflected from that angular increment, $\Delta\theta_i$, to the total energy reflected. In the illustrated embodiment where a reflected illumination on target surface 28 which is unmodified from that incident on the reflector 14 is desired, the light reflected from each angular increment, $\Delta\theta_i$, to a corresponding incremental area on target surface 28 is also characterized by the same energy ratio in the target surface 28. In this embodiment whatever energy distribution is incident on the reflector surface is faithfully reproduced on the target surface 28 less inherent reflector losses. It is also entirely within the scope of the invention to provide uniform reflected illumination of the target surface 28, or as described below an energy distribution of the reflected energy onto the target surface 28 which is arbitrarily different from the energy distribution on the reflector surface according to design control.

This ratio equality in the illustrated embodiment thus defines an inner radius of ring 24 corresponding to the incremental angle, $\Delta\theta_1$, of the reflector 14. Utilizing a reflected angle calculation, the normal to the corresponding incremental area of the reflector 14 can be derived from and is the bisector of the angle between the incoming ray from the source 10 to a center point of the incremental area of the reflector 14 and the outgoing reflected ray from the center point to the center of ring 24 on the target. However, it must be expressly understood that other points other than the centers of the incremental area and the ring 24 can be equivalently employed. For example, calculations could be one edge of the incremental area to a corresponding edge of the ring 24.

The corresponding incremental reflecting area is thus defined by its spatial position relative to source 10 and the normal of its surface at the point of interest. Its end point on the reflector surface is the starting point for the next incremental area corresponding to angle, $\Delta\theta_2$. The calculations for the reflector points continue until all the incremental areas corresponding to the angular increments, $\Delta\theta_i$, are defined. What results is a numerical table of calculated data points corresponding to the starting and ending points for each incremental area which serve to define the reflector surface. Given a set of points in space, it is possible to derive an analytical function defining a smooth curve or surface in space on which those points will lye, namely a polynomial series with numerically calculated coefficients. Numerous computer curve tracing utility programs exist which provide for this capability. This portion of the method could thus be rendered into a computerized analytical function, if desired or applicable and the entire reflector surface then defined by the analytical function.

Some preferred embodiments can simply be calculated as described above. Others would utilize modifying calculations to the energy distribution of the angular increments. As an example, the near cosine fall off of the directly radiated beam, a factor could be included in the calculations for the overlaid, reflected beam to compensate for the fall off and smooth it out. In other words, the reflected beam could be more heavily weighted or concentrated in the region of the fall off of the directly radiated beam to smooth or null it out.

As described above, calculations for the magnification ratio of the different reflector increments, $\Delta\theta_i$, as a function of the target-to-source distance could also be compensated or nulled out by weighting or modifying the concentration of reflected light from reflector 14.

In another embodiment compensation might be performed by adding a multiplier, ratio, defined curve offset, sag or other compensation in the areal distribution of the overlaid reflected beam onto the target surface, which compensation is back-calculated into the distribution of the energy in the reflected beam as determined by the two dimensional reflector profile.

If extreme accuracy were demanded or desired for certain applications, the reflected beam energy distribution derived from the two dimensional profile of the reflector could be replaced by a reflected beam energy distribution derived from a three dimensional reflector surface. In this case, the angular increments are given by an angle pair, $(\Delta\theta_i, \Delta\phi_i)$ and the corresponding incremental areas or zones are not surfaces of revolution as assumed above, but are areal patches on the reflector surface.

The preferred embodiment provides a smooth, flat beam profile at the target surface that when multiple units of the invention are utilized in an array. The array provides an extremely smooth total distribution without 'hot spots' associated with the prior art. The result is a smooth, highly efficient and effective beam that in most applications does not require any diffuser or additional optical treatment.

The method of the invention in which a transfer function is employed as described above to design the reflector shape is summarized in the Table below.

TABLE

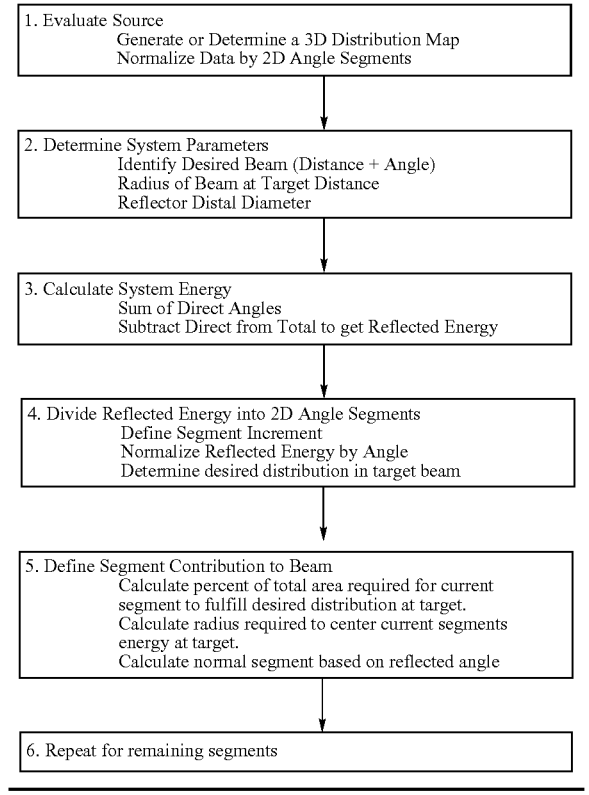

The preferred embodiments could be constructed as reflectors, a TIR optic that can optionally be attached onto the LED package or an OEM package replacement optic.

Figure 4:
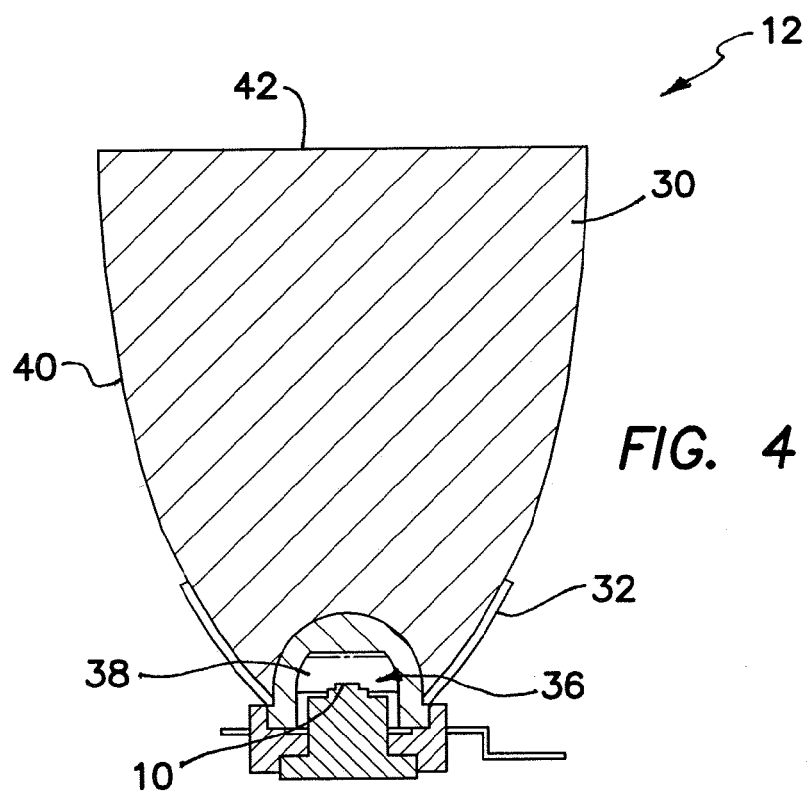
FIG. 4 is a cross-sectional drawing of another embodiment of the invention with the open reflector of FIG. 1 replaced by a solid molded TIR reflector.

The invention further illustrated in a plurality of embodiments. FIG. 4 is a cross-sectional diagram of a device 12 in which reflector 14 is replaced by a total internal reflector 30 which has an exterior surface 40 provided with the three defined zone shapes of FIG. 1, namely either a parabola, a straight cone, and ellipse or a parabola, transition zone, and ellipse. TIR 30 is also provided with a basal reflective treatment or coating 32 to insure that internal reflection is also provided at what might otherwise be unfavorable angles for internal reflection within TIR 30. Emitter 10 is provided in a conventional LED package 34, which normally provides no refraction of the light from emitter 10. The interior space 36 between emitter 10 and package 34 is filled with an optical gel or material 38 which provides index matching so that there are no optical discontinuities between emitter 10 and the surface of package 34. An optical matching adhesive is also provided between the surface of package 34 and the conforming surface of TIR reflector 30 attached on it, so that the only optical events encountered by light rays radiated from emitter 10 are total internal reflection from surface 40 or coating 32, and refraction through aperture interface 42.

Figure 5:
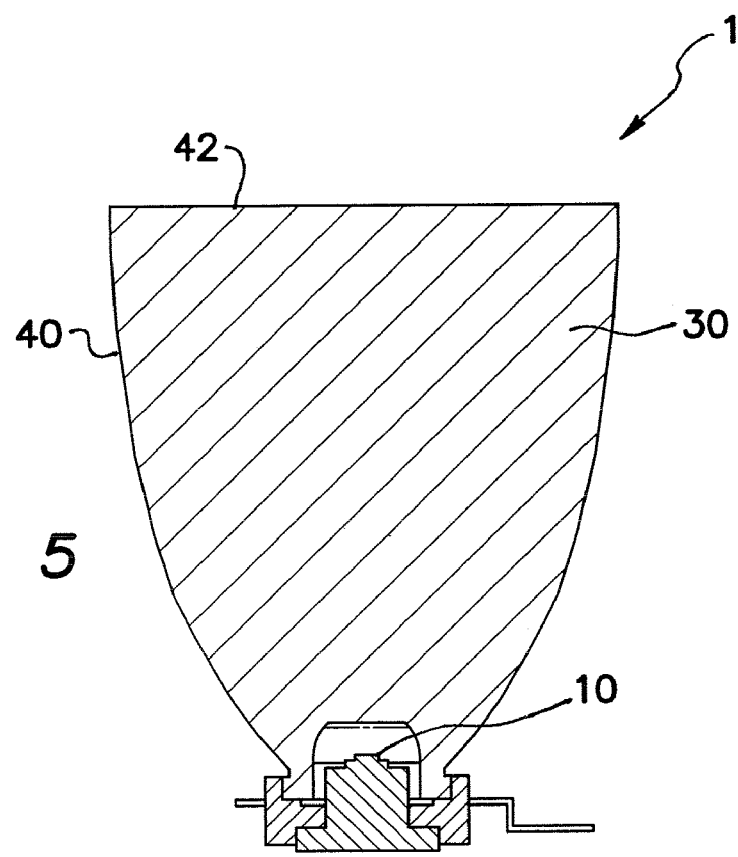
FIG. 5 is a cross-sectional drawing of an embodiment of the invention where the TIR reflector of FIG. 4 is molded as the protective cover of the LED and incorporated in the manufacture of the LED itself.

FIG. 5 is a cross-sectional diagram of a device 12 similar to that of FIG. 4 in which TIR reflector 30 is integrally made with the manufacture of LED package 34 as an OEM manufacture.

Figure 6:
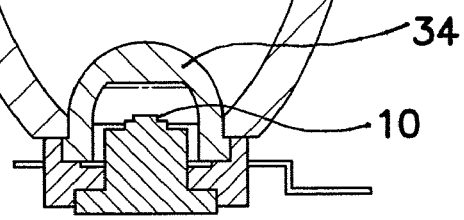
FIG. 6 is a cross-sectional drawing of the reflector assembly of an embodiment of the invention where the reflector is derived from a transfer function and may be called a super-areal light device.

FIG. 6 is a cross-sectional diagram of a device 12 which is provided with the super-areal shaped reflector 14 as determined by the transfer function described above. The emitter 10 is provided with conventional LED packaging 34 as described above in connection with FIG. 4.

Figure 8:
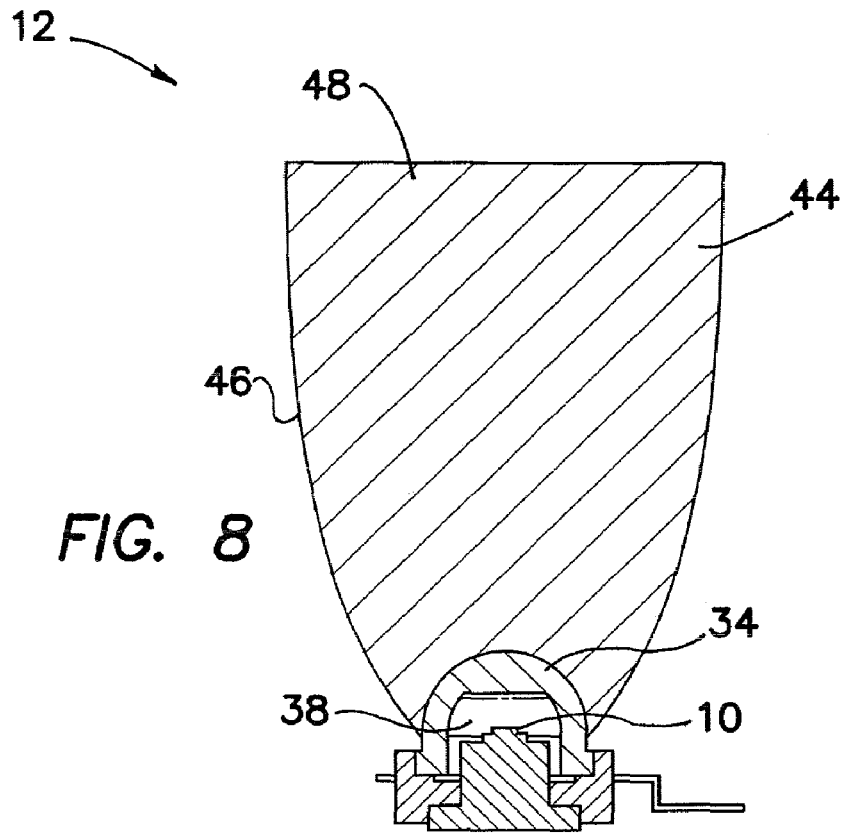
FIG. 8 is a cross-sectional drawing of the embodiment where of FIG. 6 where the reflector is replaced by a solid molded TIR reflector.

FIG. 8 is a cross-sectional diagram of a device 12 which a TIR reflector 44 has been substituted for the super-areal shaped reflector 14 of FIG. 6 and which is provided a super-areal shaped exterior surface 46 as derived from the transfer function described above in connection with FIG. 7.

Figure 9:
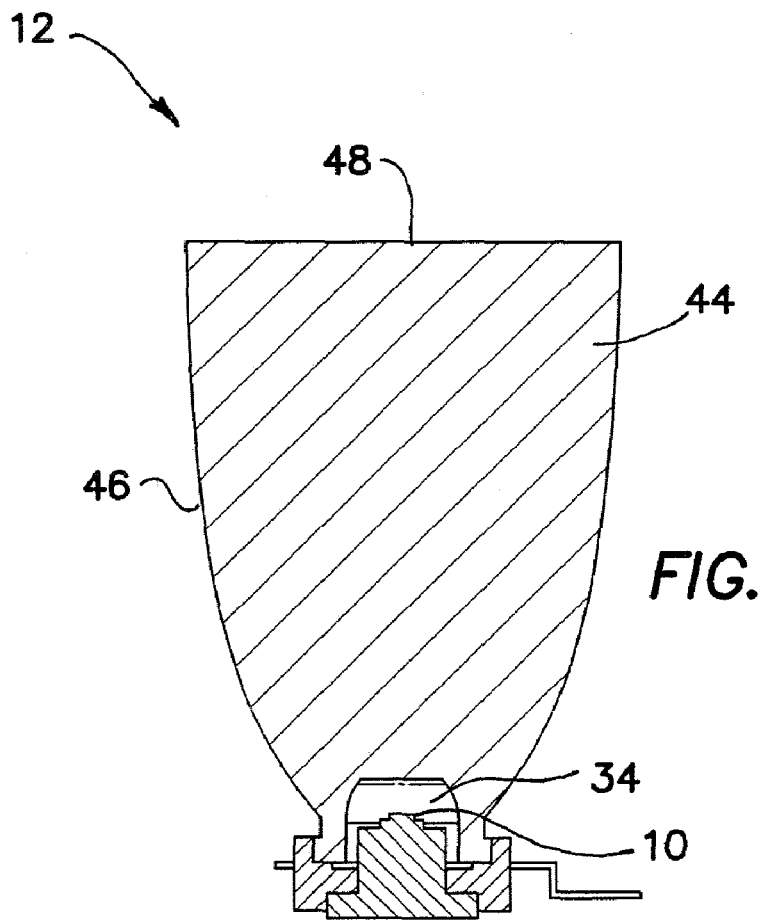
FIG. 9 is a cross-sectional drawing of an embodiment where the TIR reflector of FIG. 7 is molded as the protective cover of the LED and incorporated at time of manufacture of the LED.

FIG. 9 is a cross-sectional diagram of a device 12 similar to that of FIG. 8 in which TIR reflector 44 is integrally made with the manufacture of LED package 34 as an OEM manufacture.

Figure 10:
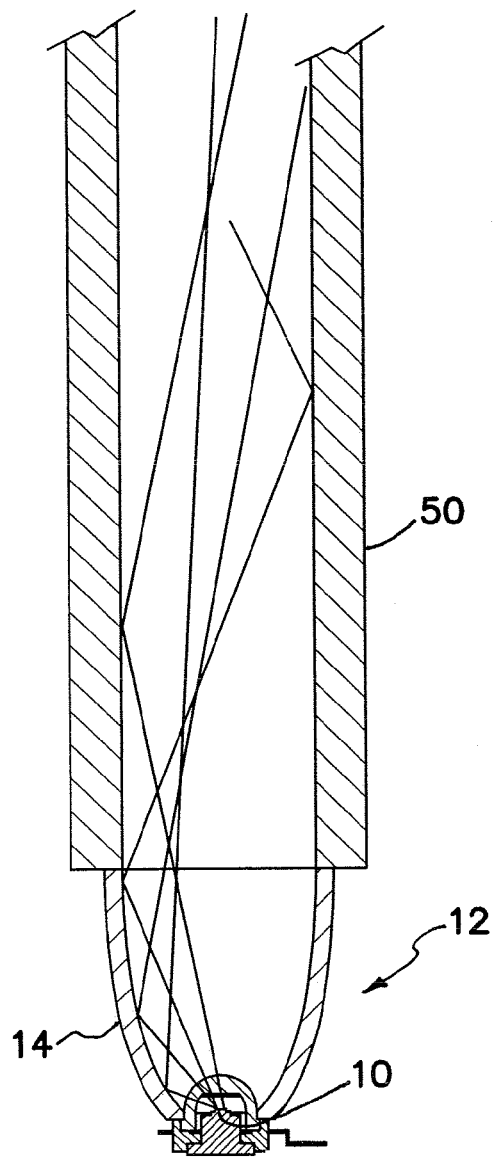
FIG. 10 is a cross-sectional drawing of the triconic reflector of the invention which is utilized to introduce energy into a fiber. The drawing shows the rays all being within the numerical aperture of the fiber for maximum coupling efficiency.

FIG. 10 is a cross-sectional diagram of a device 12 of FIG. 1, 4 or 5 coupled to the input of a fiber 50. The fiber 50 may be a hollow, solid, single or stranded. FIG. 10 shows a single hollow fiber 50 for the purposes of simplicity.

Figure 11:
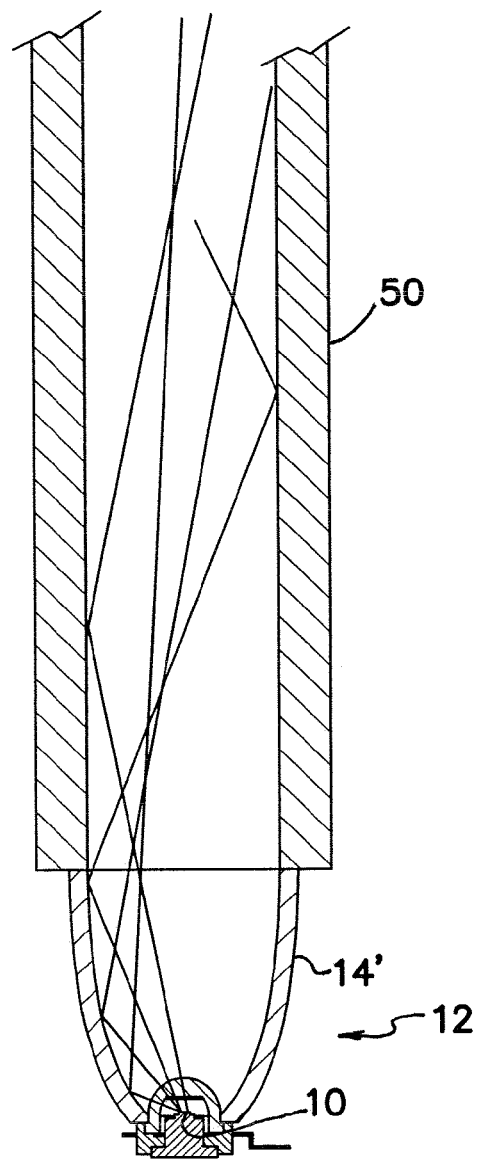
FIG. 11 is a cross-sectional drawing of the super-areal light of the invention coupled to a fiber.

FIG. 11 is a cross-sectional diagram of a device 12 of FIG. 6, 8 or 9 coupled to the input of a fiber 50. The fiber 50 may be a hollow, solid, single or stranded. FIG. 9 shows a single hollow fiber 50 for the purposes of simplicity.

Figure 12:
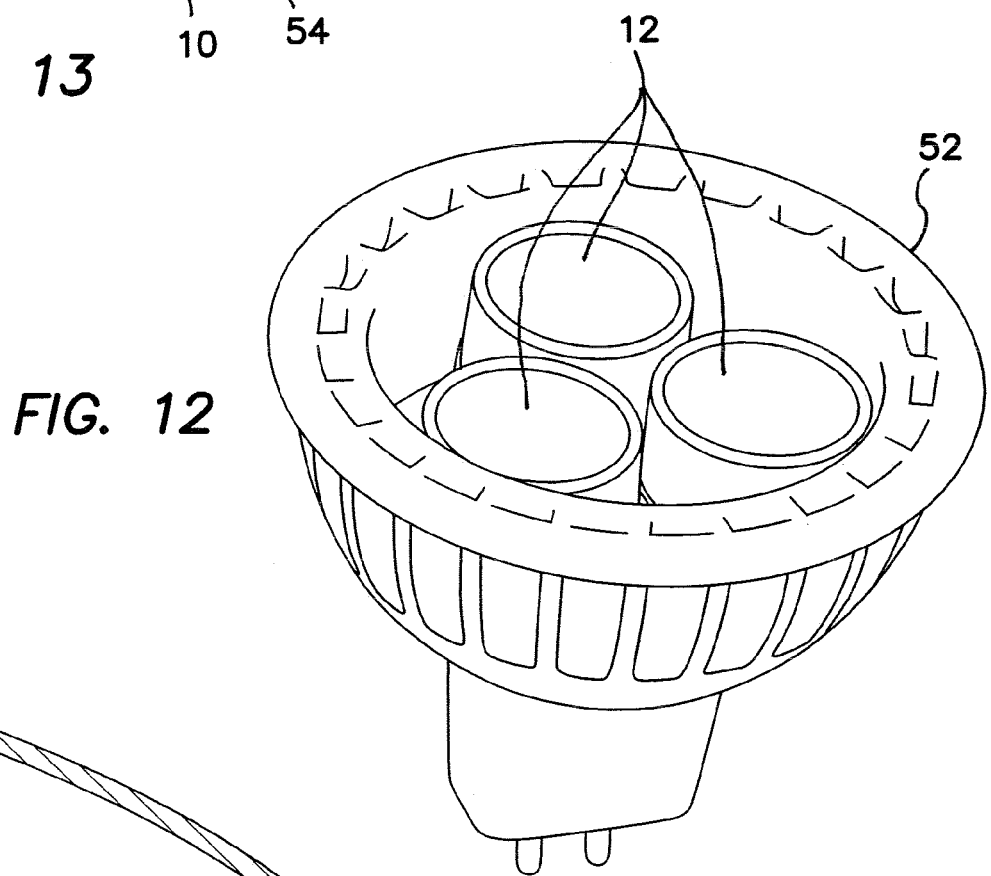
FIG. 12 is an array of devices of the invention combined into a light fixture.

Device 12 is generally meant to include some type of reflector 14 and a light source 10, but may also include additional optical, structural and mechanical elements, which are generally referred to collectively in this specification as a light fixture. FIG. 12 is a perspective view of a light fixture 52 which includes an array or plurality of devices 12 as shown in any one of the FIGS. 1-9. The elements of fixture 52 are conventional and may include additional optical elements. The design of the array can be configured to any configuration or arrangement of light arrays now known or later devised.

Figure 13:
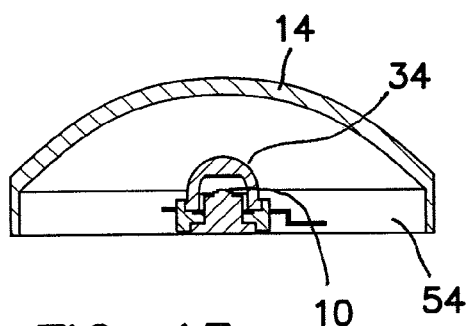
FIG. 13 is a cross sectional diagram of a reflex LED light source in a super areal light device.

FIG. 13 is a cross-sectional diagram of a device 12, which is called a reflex light source in this specification, which reflector 14 has been designed according to the teachings connected with FIG. 7 and the super areal light. Further detail on the reflex device 12 is provided in U.S. patent application Ser. No. 10/361,137 and entitled Method and Apparatus for the Efficient Collection and Distribution of Light for Illumination, which is incorporated herein by reference. Any of the reflectors of FIGS. 6-9 could be employed in the reflex device 12 of FIG. 13. Emitter 10 is contained within a conventional LED package 34, positioned on the optical axis of reflector 14 and turned to face the base of reflector 14. The reflector 14 has a defined shape derived from the transfer function, which has as inputs: the three dimensional radiation pattern of the light source; beam parameters, such as light source-to-reflector distance, reflector-to-surface distance, and beam diameter; system parameters of the reflector 14 such as reflector size and aperture size of the reflector 14; and a desired energy distribution on the surface. The transfer function has as outputs: an amount of radiated energy propagating through the aperture of the reflector 14; and a calculated position and orientation of each point on the reflector 14 as a function of angle needed to provide the desired energy distribution on the surface, which calculation defines the shape of the reflector 14 necessary to provide a reflected energy pattern. It is to be understood that the inputs and outputs of the transferred function may in all embodiments be increased or decreased according to the application at hand. The listing here of the inputs and outputs is not intended to be limiting, and fewer or more inputs and outputs can be included without departing from the spirit and scope of the invention. The transfer function configures the shape of the reflector 14 to send reflected light from a first portion of the reflector 14 extending from the base of the reflector 14 to a predetermined demarcation on the reflector 14 to a first portion of the energy distribution on the surface which is arbitrarily designer selected, such as an outer. portion of the illumined surface 28 so that the heat sink 54 and light source 10 are avoided and the amount of figure losses of device 12 minimized. The transfer function configures the shape of the reflector 14 to send reflected light from a second portion of the reflector 14 extending from the predetermined demarcation on the reflector 14 to the aperture of the reflector 14 to a second portion of the energy distribution on the surface which is arbitrarily designer selected, such as an inner portion of the illumined surface 28. The predetermined demarcation on the reflector 14 is chosen in the illustrated embodiment at a position such that light reflecting from the second portion of the reflector 14 is not generally obstructed by the heat sink 54 and light source 10 in any case. In the illustrated embodiment, light reflecting from the first portion of the reflector 14 is in essence directed around the heat sink 54 and light source 10 to the surface 28. However, it must be understood that according to the invention light from the first and second portions of the reflector 14 can be directed to any portion of surface 28.

In additional, the reflex device 12 of FIG. 13 could be alternatively embodied with a triconic reflector of the type as shown in FIGS. 1-5.

Figure 14:
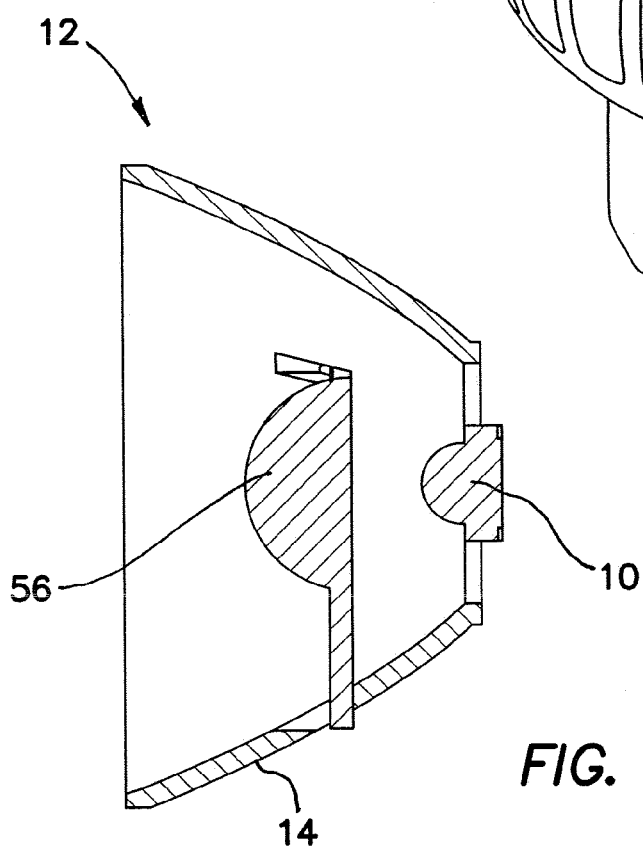
FIG. 14 is a cross sectional diagram of a hybrid LED light source in a super areal light device.

FIG. 14 is a cross-sectional drawing of an embodiment, call in this specification a hybrid LED light source, where a lens 56 is disposed longitudinally forward of reflector 14 of the type described in connection with FIGS. 6-9 for allowing radiated energy directly from the light source 10 to propagate through the lens 56 to the illuminated surface 28 to provide a directed energy distribution pattern on the illuminated surface 28. The reflector 14 again has a surface and defined shape derived from a transfer function as described above, but which may also include part of the inputs lens parameters, and as part of the outputs an amount of directed radiated energy propagating through the lens 56; a remainder of the total available radiated energy from the light source 10 less the energy of the directed light propagating to the illuminated surface 28 through the lens 56; and a calculated position and orientation of each point on the surface of the reflector 14 as a function of angle needed to provide the desired composite energy distribution on the illuminated surface 28. The calculation defines the shape of the reflector 14 necessary to provide a reflected energy pattern to overlay the directed energy pattern to form the designer controlled composite energy distribution on the surface 28. Further detail on the hybrid device 12 is provided in U.S. patent application Ser. No. 10/897,297 and entitled Improved Light Source Using Light Emitting Diodes And An Improved Method Of Collecting The Energy Radiating From Them, which is incorporated herein by reference.

In additional, the hybrid device 12 of FIG. 14 could be alternatively embodied with a triconic reflector of the type as shown in FIGS. 1-5.

Many alterations and modifications may be made by those having ordinary skill in the art without departing from the spirit and scope of the invention.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An apparatus for illuminating a illumined surface comprising:

a light source whose intensity varies as a function of the angles of the light rays radiated from the light source in a three dimensional radiation pattern, and a reflector having a base and aperture, the reflector being proximate to the light source, defining a system half angle by the optical aperture of the reflector and allowing directly radiated energy to propagate from the light source through the optical aperture of the reflector to the illumined surface to provide a directly radiated energy distribution pattern on the illumined surface, the reflector having three distinct shaped zones, each zone providing a surface of revolution, the first zone being a parabolic surface of revolution, the second zone being a straight line surface of revolution and the third zone being an elliptical surface of revolution, in that order, beginning with the base of the reflector and moving toward the optical aperture of the reflector, without necessity of smooth transitions between the adjacent zones to allow freely controlled reflected energy distribution pattern to be overlaid onto the directly radiated energy distribution pattern on the illumined surface, which reflected energy distribution pattern combines with the directly radiated energy distribution pattern to produce a freely controlled composite energy distribution pattern on the illumined surface.

2. The apparatus of claim 1 where the three zones are arranged and configured so that substantially all the light generated from the light source is in the controlled composite energy distribution pattern on the illumined surface.

3. The apparatus of claim 1 where the three zones are arranged and configured so that at least 90% of the light generated from the light source is in the controlled composite energy distribution pattern on the illumined surface.

4. The apparatus of claim 1 where the reflector comprises a total internal reflector (TIR).

5. The apparatus of claim 4 where the light source comprises an LED light source and where the total internal reflector (TIR) is integrally manufactured as a package covering for or is optically integrated with the LED light source.

6. The apparatus of claim 4 where the total internal reflector has an exterior surface and further comprising a reflective coating disposed on a selected portion of the total internal reflector to insure internal reflection of light therein.

7. The apparatus of claim 5 where the total internal reflector has an exterior surface and further comprising a reflective coating disposed on a selected portion of the total internal reflector to insure internal reflection of light therein.

8. An apparatus for illuminating a surface comprising:
a light source whose intensity varies as a function of the three dimensional solid angles of the light rays radiated from the light source, and
a reflector having a base and optical aperture, the reflector being proximate to the light source, defining a system angle by the optical aperture of the reflector and allowing directly radiated energy to propagate from the light source through the optical aperture of the reflector to the surface to provide a directly radiated energy distribution pattern on the surface,
the reflector having at least two conic shaped zones and another zone, each providing a surface of revolution, the first zone being parabolic, the second zone being a flat transition surface and the third zone being elliptical, in that order, beginning with the base of the reflector and moving toward the optical aperture of the reflector, the flat transition surface extending between the first and third zones, without necessity of any smoothness where the first, second and third zones join each other, to provide a freely controlled reflected energy distribution pattern overlaid onto the directly radiated energy distribution pattern on the surface, which reflected energy distribution pattern combines with the directly radiated energy distribution pattern to produce a freely controlled composite energy distribution pattern on the surface.

9. An apparatus for illuminating a surface comprising:
a light source whose intensity varies as a function of the angles of the light rays radiated from the light source in a three dimensional radiation pattern, and
means for reflecting light, the means having a base and an optical aperture, the means being proximate to the light source, defining a system half angle by the optical aperture of the means and allowing directly radiated energy to propagate from the light source through the optical aperture of the means to the surface to provide a directly radiated energy distribution pattern on the surface, the means having three distinct shaped zones, each providing a surface of revolution, the first zone being parabolic, the second zone being linear and the third zone being elliptical, in that order, beginning with the base of the means and moving toward the optical aperture of the means without necessity for smoothness between zones, to provide a freely controlled reflected energy distribution pattern overlaid onto the directly radiated energy distribution pattern on the surface, which reflected energy distribution pattern combines with the directly radiated energy distribution pattern to produce a freely controlled composite energy distribution pattern on the surface.

10. A method for illuminating a surface comprising:
providing a size and shape of a parabolic zone, linear zone and elliptical zone of a reflector to produce an arbitrarily designed illumination pattern;
radiating light from a light source whose intensity varies as a function of the three dimensional solid angles of the light rays radiated from the light source, and
directly radiating light from the light source to the surface to provide a directly radiated energy distribution pattern on the surface,
reflecting light from the light source from the first parabolic zone of the reflector proximate to the light source onto a composite energy distribution pattern on the surface, the first parabolic zone being a surface of revolution using a segment of a parabola;
reflecting light from the light source from the second linear zone of the reflector adjacent to the first parabolic zone onto the composite energy distribution pattern on the surface, the second linear zone being a surface of revolution using a line segment; and
reflecting light from the light source from the third elliptical zone of the reflector adjacent to the second linear zone onto the composite energy distribution pattern on the surface, the third elliptical zone being a surface of revolution using a segment of an ellipse.

11. The method of claim 10 where directly radiating and reflecting light substantially transmits all the light generated from the light source into the arbitrarily designed illumination pattern on the surface.

12. The method of claim 10 where directly radiating and reflecting light transmits at least 90% of the light generated from the light source into the arbitrarily designed illumination pattern on the surface.

* * * * *

UNITED STATES PATENT AND TRADEMARK OFFICE
CERTIFICATE OF CORRECTION

| | | |
|---|---|---|
| PATENT NO. | : 7,438,447 B2 | Page 1 of 1 |
| APPLICATION NO. | : 11/633877 | |
| DATED | : October 21, 2008 | |
| INVENTOR(S) | : Ronald G. Holder and Greg Rhoads | |

It is certified that error appears in the above-identified patent and that said Letters Patent is hereby corrected as shown below:

In the drawings, sheet 3, Fig. 3, reference numeral 22 is a bracket which should only encompass elements B, C, and D, and not A.

Replace the term "900°" found in column 9, line 5, with the term "90°".

Replace the term "16b" found in column 10, line 26, with the term "16c".

Replace the term "16b" found in column 10, line 28, with the term "16c".

Replace the term "16b" found in column 10, line 38, with the term "16c".

Signed and Sealed this

Third Day of August, 2010

David J. Kappos
*Director of the United States Patent and Trademark Office*